United States Patent
Rananavare

(10) Patent No.: US 10,508,344 B1
(45) Date of Patent: Dec. 17, 2019

(54) STABILIZED ALKALINE HYDROGEN PEROXIDE FORMULATIONS

(71) Applicant: M-R Advanced Technologies, LLC, Hillsboro, OR (US)

(72) Inventor: Shankar Rananavare, Hillsboro, OR (US)

( * ) Notice: Subject to any disclaimer, the term of this patent is extended or adjusted under 35 U.S.C. 154(b) by 0 days.

(21) Appl. No.: 16/408,781

(22) Filed: May 10, 2019

Related U.S. Application Data

(60) Provisional application No. 62/669,779, filed on May 10, 2018.

(51) Int. Cl.
  *C11D 3/39* (2006.01)
  *C23F 1/26* (2006.01)
  *H01L 21/3213* (2006.01)

(52) U.S. Cl.
  CPC .......... *C23F 1/26* (2013.01); *H01L 21/32134* (2013.01)

(58) Field of Classification Search
  CPC .......................... C11D 11/0047; C11D 3/3947
  USPC ........................................ 510/175, 372, 375
  See application file for complete search history.

(56) References Cited

U.S. PATENT DOCUMENTS

| | | | |
|---|---|---|---|
| 2014/0096793 A1* | 4/2014 | Kweskin | H01L 21/02054 134/1.3 |
| 2016/0237315 A1* | 8/2016 | Stender | B24B 37/20 |
| 2017/0110363 A1* | 4/2017 | Aoyama | B08B 3/12 |

* cited by examiner

*Primary Examiner* — Gregory E Webb
(74) *Attorney, Agent, or Firm* — Mohr Intellectual Property Law Solutions, PC

(57) ABSTRACT

Formulations for stabilizing hydrogen peroxide, comprising water soluble $Zn^{+2}$ ions at 0.7 to 100 parts per million of an alkaline hydrogen peroxide solution. In some examples, the alkaline hydrogen peroxide solution is a silicon wafer cleaning solution comprised of $H_2O_2$ and $NH_4OH$—$H_2O$ and the water soluble $Zn^{+2}$ ions are present at 3 to 100 parts per million of the silicon wafer cleaning solution. In some examples, the alkaline hydrogen peroxide solution is a wet etching formulation selective for TiN and the water soluble $Zn^{+2}$ ions are present at 0.7 to 10 parts per million of the wet etching formulation. In some examples, the alkaline hydrogen peroxide solution is a wet etching formulation selective for Ti and Zn ions are present at 2 to 7 parts per million.

20 Claims, No Drawings

STABILIZED ALKALINE HYDROGEN PEROXIDE FORMULATIONS

CROSS REFERENCE TO RELATED APPLICATIONS

This application claims priority to copending U.S. Application, Ser. No. 62/669,779, filed on May 10, 2018, which is hereby incorporated by reference for all purposes.

BACKGROUND

The present disclosure relates generally to compositions containing hydrogen peroxide (H2O2). In particular, compositions stabilizing hydrogen peroxide in alkaline solutions are described.

Hydrogen peroxide is useful in a broad range of applications, for example, as a household cleaner, or in numerous industrial applications, including cleaning integrated circuits, lithographic processing, and coating drilling bits with hard films.

In the high-tech industry, a mixture of H2O2 and Ammonium hydroxide provides an alkaline (pH>7) solution, which can oxidize and remove surface-bound organic contaminant molecules. With regard to integrated circuits, a well-established wafer cleaning method known as the RCA method employs an alkaline H2O2/Ammonium hydroxide mixture, commonly referred to as the standard clean 1 (SC1) formulation. A common problem with the use of SC1 is that new batches of the SC1 solution need to be frequently mixed as the H2O2 decomposes rapidly at temperatures above room temperature, making even short-term storage of the cleaning solution difficult.

Modern integrated chip (IC) design provides another application where stabilized H2O2 would be beneficial. Modern IC design entails fabricating transistors and relevant circuit elements in silicon, which are electrically interconnected by high conductivity metals, such as copper. A multilayer electrical wiring of copper tracks is insulated using materials of low dielectric constant, k, to improve the speed of the ICs.

Modern advanced lithographic methods, such as the dual damascene method developed by IBM (Edelstein), utilize a sacrificial metal layer, the so-called hard mask of Ti or TiN. The sacrificial metal layer protects the underlying low k material (i.e., the material with a low dielectric constant) from plasma processing. In subsequent stages of processing, it is necessary to remove the residual hard mask material without affecting other exposed materials, such as copper, low k dielectric, such as carbon doped silicon dioxide (CDO), or silicon nitrides. Furthermore, plasma processing leads to undesirable polymer residues, which also need to be removed before the next processing step.

The traditional approach to remove hard mask material includes chemical mechanical polishing where a slurry of abrasive material removes the film. However, the chemical mechanical removal processes are not optimal since they can physically damage the inner porous low k dielectric layer. The potential for damage increases as the porosity of the dielectric increases and as the dielectric constant of the material decreases.

One method to remove hard mask material involves selective wet etching. To chemically etch Ti and TiN requires several chemical ingredients that react with Ti and TiN films to create soluble chemical species. In general, selective wet etching requires harsh chemicals that can result in some loss of dielectric and copper, the latter by chemical corrosion. Removing the hard mask material with a stabilized H2O2 formulation would be a superior approach.

A brief summary of references relevant to the above described technical challenges is provided in the paragraphs below.

Several peroxide stabilizers employing colloidal particles are known, such as U.S. Pat. Nos. 2,872,293 and 4,320,102. These colloidal systems, as well as phosphate/phosphonates described in U.S. Pat. No. 4,294,575, act to scavenge metal redox ions such as Fe and Cu that are responsible for peroxide decomposition.

Table 1 illustrates the enhanced decomposition of H2O2 as function of temperature or of $Cu^{+2}$ ion concentration in absence of colloids to help demonstrate the existing limitations of unstabilized H2O2.

TABLE 1

Decomposition of hydrogen peroxide in alkaline medium (pH = 10.5). Effect of a copper salt accelerant.

| Components | Copper Salt (ionic) Concentration (Ppm (w/w)) | Temperature (° C.) | First order K $(min^{-1})$ | Half-life (min) |
|---|---|---|---|---|
| H2O2 (23.5 mM) + NH4OH (3.2 mM) | none | 21 | $(7.5 \pm 2.5) \times 10^{-5}$ | 10000 ± 3000 |
| H2O2 (23.5 mM) + NH4OH (3.2 mM) | 0 (0) | 65 | 0.024 ± 0.003 | 29 ± 4 |
| + CuSO4.5H2O | 10 (2.5) | 21 | 0.0029 ± 0.001 | 240 ± 70 |
| + CuSO4.5H2O | 20 (5) | 21 | 0.014 ± 0.002 | 48 ± 6 |
| + CuSO4.5H2O | 40 (10) | 21 | 0.020 ± 0.003 | 35 ± 5 |

Abbreviations: mM refers to millimolar concentration. ppm here refers to parts per million calculated by dividing the weight of the additive by the weight of the solution and multiplying the result by one million. The numbers in parenthesis correspond to the copper ion concentration in ppm units. K is the rate constant for H2O2 degradation; Half-life refers to the time required to decompose half the amount of H2O2 in solution. The concentration of peroxide was determined spectrophotometrically by using Potassium Titanium oxalate.
(Reference: *Analyst*, 1980, 105, 950-954).

Table 1 demonstrates how an increase in temperature of 44° C. or an increase of copper ion concentration, even at ppm levels, decreases the half-life of peroxide in alkaline medium from 3-4 hours to 30-40 minutes. Colloidal systems can bind to ions like copper to suppress degradation. However using colloidal systems can lead to particle contamination, which can create unwanted defects. Therefore, colloidal systems are avoided in the semiconductor industry.

In an alkaline medium, it has been established that $OH^-$ ion, or for that matter, most anions except $I^-$, are not involved in decomposing peroxide; although they are postulated to be present in the kinetics of uncatalyzed peroxide decomposition. Certain cations, such as Magnesium ($Mg^{+2}$), also hinder peroxide decomposition. However, the precise mechanism of peroxide decomposition is dependent on the composition of the peroxide formulation and is, therefore, not well understood.

With regard to the selective removal of Ti and TiN hard masks from a wafer surface without affecting exposed materials, such other metals (Cu, Al, etc.) and insulators (low K and Ultra-low K dielectrics), the references summarized in the following paragraphs are relevant.

U.S. Pat. No. 8,916,479 describes an etching solution including ammonium hydroxide and hydrogen peroxide. The weight ratio of ammonium hydroxide to hydrogen peroxide is between 1:600 and 1:3,000, between 1:1,000 and 1:3,000, or even between 1:500 and 1:3,000. These are the same components used in SC1/RCA1 mixtures.

US Patent Publication 2016/0130500 describes compositions comprising at least one oxidizing agent, at least one etchant, at least one metal corrosion inhibitor, at least one chelating agent, and at least one solvent. The etchants include common bases, such ammonium, potassium hydroxide, Tetramethylammonium hydroxide, and ammonium fluoride. The oxidizing agent could be H2O2 or Fe based compositions. The solvent may include water or small chain alcohols. Complexing agents include ethylenediaminetetraacetic acid (EDTA), ethylenediaminetetraacetic acid diammonium salt, and (1,2-cyclohexylenedinitrilo)tetraacetic acid (CDTA). Corrosion inhibitors include 5-amino-1,3,4-thiadiazole-2-thiol (ATDT), 2-amino-5-ethyl-1,3,4-thiadiazole, benzotriazole (BTA), 1,2,4-triazole (TAZ), tolyltriazole, 5-methyl-benzotriazole (mBTA), and 5-phenyl-benzotriazole.

US Patent Publication 2017/0110363A1 teaches combining a strong base (KOH) and a strong oxidant (hydrogen peroxide). Under the conditions of high pH, as used in these formulations, using inorganic base results in water-soluble titanates. The use of Zn salt and aminopolymethylene phosphoric acid to prevent damage to metal wiring is described.

Thus, there exists a need for stabilized hydrogen peroxide formulations that improve upon and advance the design of known hydrogen peroxide formulations. Examples of new and useful stabilized hydrogen peroxide formulations relevant to the needs existing in the field are discussed in the Detailed Description section below.

Known references relevant to stabilized alkaline hydrogen peroxide formulations include U.S. Pat. Nos. 2,872,293, 4,320,102, 4,294,575, and 8,916,479; and U.S. patent application publication numbers 20160130500 and 20170110363A1. The complete disclosures of the above patents and patent applications are herein incorporated by reference for all purposes.

SUMMARY

In one embodiment, alkaline (pH>7) solutions of hydrogen peroxide may be stabilized using parts per million levels of Zinc ions/complexes in selective etch or cleaning formulations, such as SC-1 or RCA-1. One preferred embodiment includes water-soluble Zn salts and/or complexes, for example, sulfates and nitrates, among many others, to reduce or prevent degradation of H2O2 in the cleaning formulations. In one example, a cleaning formulation comprises water, a 29% weight by volume of water aqueous ammonia solution, and a 30% weight by volume of water aqueous H2O2 solution in a volumetric ratio of 5:1:1, respectively, with the further equivalent addition of 3 to 100 ppm of Zn ions through water soluble Zn salts.

In another embodiment, stabilized solutions of hydrogen peroxide may be employed in the removal/dissolution of films made from Titanium (Ti) and related compounds, such as titanium nitride (TiN), commonly used as hard masks in advanced lithographic processing as well as hard film coating of drilling bits.

More specifically, formulations are described that may be used for the removal of residual Ti, TiN and polymer residues after the dual damascene process to fabricate copper interconnects. The formulations achieve selective removal of hard mask films (commonly made of Ti and TiN) and polymer residues, while maintaining compatibility with the exposed copper, aluminum and other low or ultra-low K dielectrics. The formulations further provide enhanced peroxide stability allowing for longer bath-life.

DETAILED DESCRIPTION

The disclosed formulations will become better understood through review of the following detailed description. The detailed description provides merely examples of the various inventions described herein. Those skilled in the art will understand that the disclosed examples may be varied, modified, and altered without departing from the scope of the inventions described herein. Many variations are contemplated for different applications and design considerations; however, for the sake of brevity, each and every contemplated variation is not individually described in the following detailed description.

Throughout the following detailed description, examples of various formulations are provided. Related features in the examples may be identical, similar, or dissimilar in different examples. For the sake of brevity, related features will not be redundantly explained in each example. Instead, the use of related feature names will cue the reader that the feature with a related feature name may be similar to the related feature in an example explained previously. Features specific to a given example will be described in that particular example. The reader should understand that a given feature need not be the same or similar to the specific portrayal of a related feature in any given example.

Definitions

The following definitions apply herein, unless otherwise indicated.

"Substantially" means to be more-or-less conforming to the particular dimension, range, shape, concept, or other aspect modified by the term, such that a feature or component need not conform exactly. For example, a "substantially cylindrical" object means that the object resembles a cylinder, but may have one or more deviations from a true cylinder.

"Comprising," "including," and "having" (and conjugations thereof) are used interchangeably to mean including but not necessarily limited to, and are open-ended terms not intended to exclude additional, elements or method steps not expressly recited.

Terms such as "first", "second", and "third" are used to distinguish or identify various members of a group, or the like, and are not intended to denote a serial, chronological, or numerical limitation.

"Coupled" means connected, either permanently or releasably, whether directly or indirectly through intervening components.

"Ammonical solution" means solutions derived from ammonia and derivatives of ammonia, such as tetramethyl ammonium hydroxide, or in general molecules of type N(R1,R2,R3,R4)-OH where Ri denote same or different alkyl or hydrogen groups.

One preferred embodiment of the invention includes the use of water-soluble Zn salts (e.g., sulfates, nitrates, and other soluble Zn complexes/compounds) to inhibit or prevent H2O2 degrading in alkaline cleaning formulations. In one example, a cleaning formulation comprises water, a 29% weight by volume of water aqueous ammonia solution, and a 30% weight by volume of water aqueous H2O2 solution in a volumetric ratio of 5:1:1, respectively, with the further addition of 3 to 100 ppm of Zn ions. This improved substitute for SC1 provides greater than 48 hours of useful bath lifetime.

Peroxide degradation rate K, increases exponentially with temperature. Table 1 illustrates a half-life decrease of almost a factor of 300 when going from room temperature to 65° C. This effect can be reversed using Zn salts as described later, including in Table 2 below.

According to the Zn Pourbaix diagram, Zn(OH)2 precipitates above a pH of 9 and re-dissolves at pH levels greater than 11. Therefore, at standard SC1 which has a pH of 11, Zn(OH)2 could cause particulate contamination. But it is known that ZnOH2 can be re-dissolved by adding ammonia, which is thought to complex with Zn ions to generate the so-called ammonical solutions. However, because the SC1 formulation contains ammonia, any Zn(OH)2 in the stabilized H2O2 formulation is re-dissolved, which avoids particle formation and any resulting wafer contamination.

As described above there have been many peroxide stabilizers for use in an alkaline environment. Nonetheless, the rate of H2O2 degradation is strongly dependent on the type of cations present. A priori it is difficult to predict the optimal H2O2 stabilizer for a given formulation.

During the course of developing a selective etch formulation for TiN containing TMAH/KOH/NH4F, it was discovered that the rate of peroxide degradation (as measured by O2 evolution) at 55° C. increased dramatically upon introducing TMAH in a solution made of 1:2 (V/V) 30% peroxide and deionized water (containing parts per trillion levels of metal contaminants). Adding KOH led to a slightly higher degradation rate. MgSO4 or Sodium metaphosphate, either separately or in combination, did not significantly suppress the degradation rate. Further experiments using K3PO4, acetanilide, CH3SO3H, polyacrylic acid(PAA), or glyphosate or ZrSO4 failed to suppress the rate of degradation of H2O2 resulting in more than 90% loss in peroxide concentration over 24 hours.

However, when 25 mg of ZnSO4 7H2O was added to the etch mixture (total volume 350 ml), corresponding to 72 ppm of Zinc sulfate or equivalently 16 ppm of $Zn^{+2}$ ion, the bubbling stopped immediately. The peroxide concentration loss was less than a few percent over 24 hours at 55° C. The solution pH was about 7.5-8.3 depending on the base (TMAH) and hydrogen peroxide concentration. Consistent with the effect of ammonical zinc salts, as discussed above, no precipitation was observed at this pH range. Systematic study of $Zn^{+2}$ ion concentration is shown in Table 2 below. For example, if TMAH replaces ammonia in the above alkaline solution, the ionic Zn level needed is 0.7 ppm. Further details of the etch performance are given in Example 2 below.

The last entry in Table 2 shows how the effect of copper ion induced degradation can be suppressed using zinc salts. A mixture containing equal concentration of the Cu and Zn salts at 40 ppm increased the H2O2 half-life from 35 minutes to 115 minutes.

The precise mechanism of the stability imparted by Zn is unknown at this time. At reaction pH in the presence of ammonia based compounds, such as NH4OH or NH4F, Zn ions are likely complexed to the amine, and OH groups thus do not precipitate out ZnOH2 to form colloidal particles as predicted from the Pourbaix diagram for Zn. This may help prevent potential heterogeneous catalysis effects in H2O2 degradation. Such formulation, therefore, also allows a longer bath-life for a SC1-type cleaning solution.

An alternate possibility is that HO2− anion produced by dissociation of H2O2 in basic medium could perhaps be readily complexed by Zn ions and slow the reduction rate of HO2−, and hence, H2O2 degradation.

In a semiconductor etch formulation designed for selective removal of TiN in the presence of exposed copper and ultralow k oxide nanomaterials, the ratio of KOH to TMAH allowed better control over the etch rates. TiN etch rate increased with increase in the concentration of KOH relative to TMAH; however, high concentration led to some loss of film thickness in ultra-low k films. The optimal values for main components were determined to be 0.2-0.8% NH4F, 1-2% TMAH and 0.2-0.8% KOH. Concentration is expressed in terms of weight percent of the formulation. The KOH acted as an accelerant for etch rate.

NH4F in these mixtures allows the formation of stable $TiF^{-6}$ anion that is more soluble than titanate anion. Furthermore, resulting K2TiF6 is a water soluble species that drives dissolution of Ti species into the etching solution.

The second preferred embodiment is to use soluble Zn Salts/complexes to prolong bath life of the above-mentioned selective wet etch formulation for removing TiN. In this second embodiment, a combination of KOH/TMAH bases produces K2TiF6 as solubilized species using fluorinated compounds, such as NH4F. To protect exposed metals in interconnect linings a combination of corrosion inhibitors was used. A further advantage of ammonium ions in the

TABLE 2

Decomposition of hydrogen peroxide in alkaline medium (pH = 10.5).
Effect of suppressant zinc salt concentration. Numbers in parenthesis in the
concentration column indicate the corresponding ppm concentration of Zinc ions.

| Components | Zinc Salt (ionic) Concentration. (ppm (w/w)) | Temperature (° C.) | First order K (min$^{-1}$) | Half-life (min) |
|---|---|---|---|---|
| $H_2O_2$ (23.5 mM) + NH4OH (3.2 mM) | 0 | 21 | $(7.5 \pm 2.5) \times 10^{-5}$ | 10000 ± 3000 |
| $H_2O_2$ (23.5 mM) + NH4OH (3.2 mM) | 0 | 65 | 0.024 ± 0.003 | 29 ± 4 |
| + ZnSO4.7H$_2$O | 0.8 (0.18) | 65 | 0.021 ± 0.003 | 29 ± 4 |
| + ZnSO4.7H$_2$O | 8.0 (1.8) | 65 | 0.029 ± 0.003 | 33 ± 3 |
| + ZnSO4.7H$_2$O | 12.0 (2.7) | 65 | $(1.5 \pm 0.5) \times 10^{-4}$ | 5200 ± 1700 |
| + ZnSO4.7H$_2$O | 15.0 (3.4) | 65 | $(1.5 \pm 0.5) \times 10^{-4}$ | 5200 ± 1700 |
| + ZnSO4.7H$_2$O | 20.0 (4.5) | 65 | $(1.5 \pm 0.5) \times 10^{-4}$ | 5200 ± 1700 |
| + ZnSO4.7H$_2$O | 40.0 (9.0) | 65 | $(1.5 \pm 0.5) \times 10^{-4}$ | 5200 ± 1700 |
| +1:1 mixture of 40 ppm of Zinc and Copper sulfate salts | (40:40) (10.0:9.0) | 65 | $(6.0 \pm 1.5)) \times 10^{-3}$ | 112 ± 26 |

For the particular peroxide and base composition described in Table 2, further optimization of Zn concentration established a lower limit of 3 ppm for ionic Zn concentration. However, the optimal concentration of Zn depends on the peroxide formulation composition and needs to be determined for each specific peroxide composition. For formulation is that the Zn ions tend to form ammonia complexes that are soluble at even lower pH than 9 as discussed above.

This second embodiment optimizes the need to protect copper while reducing or preventing particle defects that commonly result when copper complexes of inhibitors in high concentration precipitate on semiconductor chips. The second embodiment includes a combination of several inhibition agents in appropriate relative proportions and appropriate total concentration.

Another unique feature of the formulations described herein is the use of inorganic and organic bases to improve solubility of corrosion inhibitors. The presently disclosed formulations advantageously boost the rate of TiN etching and the selectivity for etching TiN over other materials exposed to the etching solution.

The novel formulations discussed here exploit the high solubility of fluorinated titanium complexes as compared to titanates generated with a combination of bases and peroxide oxidants. The compounds incorporated into the present formulations include water-soluble fluoride salts, and acids, such as HF and $H_2SiF_6$. The salts are useful to remove TiN in high pH environments while acids assist to remove TiN in low pH environments.

Another benefit of the formulations discussed herein results from including a combination of oxidation resistant small molecule surfactants. The optimized combination of oxidation resistant small molecule surfactants helps remove polymeric residues generated during plasma processing.

EXAMPLES

The following examples detail a sampling of specific, non-limiting hydrogen peroxide stabilizing formulations for illustrative purposes.

Example 1

In a first example, a $H_2O_2$ stabilizing formulation was formed by adding Zn ions at 3-100 ppm to a SC1 solution. The SC1 solution was made by mixing in a 1:1:5 volumetric ratio a 28% w/v aqueous ammonia solution, a 30% w/v aqueous $H_2O_2$ solution, and deionized water at 55-70° C. Adding 10 ppm of zinc salt ($ZnSO_4$ $7H_2O$) increased $H_2O_2$ lifetime to well over a day. Only 20 percent degradation of peroxide was observed during this period. For a pH range between 10 and 13, a Zn ion concentration between 3 and 100 ppm is acceptable. Over the same pH range, a preferable range of Zn ion concentration is between 3 and 10 ppm.

A suitable volumetric range of Ammonia in the SC1 solution ratio is between 0.5-1.5, that is, a volumetric ratio of 0.5-1.5 to 1 to 5 of ammonia, $H_2O_2$ and DI water, respectively. A preferred volumetric ratio of ammonia, $H_2O_2$ and DI water is 1 to 1 to 5, respectively.

Several other bases, such as NaOH or KOH or TMAH, may be used in place of ammonia in the SC1 solution. However, to inhibit or prevent precipitation of $Zn(OH)_2$, greater than 4:1 molar ratio of Ammonia to Zn is needed. Ammonia may be added as ammonium salts or ammonium hydroxide to achieve the 4:1 Ammonia:Zn molar ratio necessary to inhibit or prevent precipitation of $Zn(OH)_2$. Zn ions also suppress $H_2O_2$ degradation rates in $TMAH/H_2O_2$ based mixtures, known as Baker clean, which have been used in place of SC1 solution having pH in a range of 8-10.

Example 2

In a second example, a selective TiN etch formulation was enhanced to become a novel $H_2O_2$ stabilizing formulation by including 21 ppm of $ZnSO_4.7H_2O$ (or about 5 ppm of Zn ion). The etching formulation obtained by combining a 45% w/v aqueous KOH solution, a 25% w/v TMAH solution, and a 40% w/v $NH_4F$ solution to yield 0.59, 1.31 and 0.63 percent by weight of these components, respectively. Also, to protect against copper corrosion, a 1:1 mixture of benzotriazole and 1-2-4 triazol was added at 130 ppm. The etching formulation was diluted tenfold using an aqueous peroxide solution and deionized water in a volumetric ratio of 1:6:3 of the etching formulation, a 30% w/v aqueous $H_2O_2$ solution, and DI water, respectively.

The TiN etch rate measured at 50 C. was 540 Å/min. Almost undetectable film thickness loss was noted for low and ultralow k dielectric coated films and copper films. In this example, final effective lower concentration of Zn ions during etching was 0.7 ppm and $H_2O_2$ in the etching formulation was stable well over 24 hours. Thus, concentration of Zn ions in these formulations can be 0.7-10 ppm (note these etching formulations are further diluted by 10× during actual etching process), with a preferred range between 0.7-5 ppm of the etching formulation. The broad range of compositions of other components is tabulated in Table 3 below.

TABLE 3

Suitable concentration ranges for the wet etching formulation components in Example 2.

| Chemical Name | Concentration |
| --- | --- |
| KOH | 0.1-0.4% |
| Tetramethyl ammonium hydroxide | 0.1-1.7% |
| Ammonium Fluoride | 0.1-0.5% |
| 1,2,3-Benzotriazole/1,2,4 Triazol | 130-200 ppm |
| Zn ions(from water soluble salts) | 0.7-10 ppm |
| Water | >97% |

Example 3

In a third example, a selective Ti etch formulation compatible with exposed aluminum and copper was enhanced to become a novel $H_2O_2$ stabilizing formulation by adding 10 to 30 parts per million zinc salt. According to the Pourbaix diagram, aluminum is soluble in alkaline media (pH>7) as aluminate anion and corrodes as $Al^{+3}$ cation below pH 4.5. To inhibit or prevent corrosion of copper and aluminum, suitable corrosion inhibitors such as Benzotriazaole/Triazol combination may be used along with low molecular weight poly-acrylic acid (PAA) for aluminum.

The third example $H_2O_2$ stabilizing formulation contained 32.5 ml of 10% (w/v) of KOH; 0.125 gm of Benzotriazole; 0.5 gm of PAA (MW 1800); 0.15 gm of $ZnSO_4.7H_2O$ (21 ppm, or about 5 ppm of Zn ion); 0.5 ml of 30% $NH_4OH$; and 2000 ml of 30% peroxide. The mixture was diluted to make 7000 ml of formulation. The resulting solution (pH=8.5) dissolved 1000 Å thick metal films of Ti, Al, and Cu in 4, 14, >30 minutes respectively showing an excellent selectivity to Ti. The resulting formulation was stable well over 6 months while the formulation that did not contain Zn lost peroxide at much higher rate as discussed before. The range of suitable concentrations in the formulation is tabulated in Table 4 below. In Table 4, both Zn salt concentration as well as ionic Zn concentration (numbers in parenthesis) are provided.

TABLE 4

Suitable concentration ranges for H2O2 stabilizing
formulation components in Example 3.

| Chemical Name | Concentration |
| --- | --- |
| KOH | 300-700 ppm |
| ammonium hydroxide | 15-60 ppm |
| Hydrogen Peroxide | 8-10% |
| 1,2,3-Benzotriazole/1,2,4 Triazol | 70-200 ppm |
| Polyacrylic acid (1000-5000 MW) | 70-150 ppm |
| ZnSO4 7H2O(Zn$^{+2}$) | 10-30 ppm (2.3-7.0 ppm) |
| Water | >90% |
| pH | 8-8.5 |

The disclosure above encompasses multiple distinct inventions with independent utility. While each of these inventions has been disclosed in a particular form, the specific embodiments disclosed and illustrated above are not to be considered in a limiting sense as numerous variations are possible. The subject matter of the inventions includes all novel and non-obvious combinations and subcombinations of the various elements, features, functions and/or properties disclosed above and inherent to those skilled in the art pertaining to such inventions. Where the disclosure or subsequently filed claims recite "a" element, "a first" element, or any such equivalent term, the disclosure or claims should be understood to incorporate one or more such elements, neither requiring nor excluding two or more such elements.

Applicant(s) reserves the right to submit claims directed to combinations and subcombinations of the disclosed inventions that are believed to be novel and non-obvious. Inventions embodied in other combinations and subcombinations of features, functions, elements and/or properties may be claimed through amendment of those claims or presentation of new claims in the present application or in a related application. Such amended or new claims, whether they are directed to the same invention or a different invention and whether they are different, broader, narrower or equal in scope to the original claims, are to be considered within the subject matter of the inventions described herein.

The invention claimed is:

1. A formulation for stabilizing hydrogen peroxide, comprising water soluble Zn+2 ions in an ammonical solution at 0.7 to 100 parts per million of an alkaline hydrogen peroxide solution.

2. The formulation of claim 1, wherein:
the alkaline hydrogen peroxide solution is a silicon wafer cleaning solution comprised of H2O2 and NH4OH—H2O; and
the water soluble Zn+2 ions are present at 3 to 100 parts per million of the silicon wafer cleaning solution.

3. The formulation of claim 2, wherein the source of the water soluble Zn+2 ions is ZnSO4.7H2O.

4. The formulation of claim 2, wherein Zn ion is present at 12 to 40 parts per million of the silicon wafer cleaning solution.

5. The formulation of claim 2, wherein the silicon wafer cleaning solution is at a pH between 10 and 13.

6. The formulation of claim 2, wherein the silicon wafer cleaning solution includes:
0.5 to 1.5 parts by volume of a 29 weight to volume % aqueous ammonia solution;
1 part by volume of a 30 weight to volume % hydrogen peroxide solution; and
4.5 to 5.5 parts by volume deionized water.

7. The formulation of claim 1, wherein the alkaline hydrogen peroxide solution is a wet etching formulation including:
KOH;
tetramethylammonium hydroxide (TMAH); and
NH4F.

8. The formulation of claim 7, wherein the wet etching formulation further includes a mixture of benzotriazole and 1-2-4 triazole.

9. The formulation of claim 8, wherein the mixture of benzotriazole and 1-2-4 triazol includes equal parts benzotriazole and 1-2-4 triazole.

10. The formulation of claim 7, wherein the water soluble Zn+2 ions are present at 0.7 to 10 parts per million of the wet etching formulation.

11. The formulation of claim 7, wherein the water soluble Zn+2 ions are present at 0.7 to 5 parts per million of the wet etching formulation.

12. The formulation of claim 7, wherein the wet etching formulation includes:
0.2 to 0.8 weight % KOH;
1.0 to 2.0 weight % TMAH; and
0.2 to 0.8 weight % NH4F.

13. The formulation of claim 12, wherein the wet etching formulation further includes water at 96.4 weight % or greater.

14. The formulation of claim 7, wherein the wet etching formulation includes:
0.1 to 0.4 weight % KOH;
0.1 to 1.7 weight % TMAH;
0.1 to 0.5 weight % NH4F; and
the wet etching formulation further includes a 1:1 mixture of benzotriazole and 1-2-4 triazole at 130 to 200 parts per million.

15. The formulation of claim 14, wherein the wet etching formulation further includes water at 97 weight % or greater.

16. The formulation of claim 7, wherein the wet etching formulation is configured to selectively remove TiN in the presence of exposed copper.

17. The formulation of claim 16, wherein the wet etching formulation is configured to selectively remove TiN in the further presence of porous silicon dioxide, CDO and ultralow dielectric constant oxide nanomaterials.

18. The formulation of claim 1, wherein the alkaline hydrogen peroxide solution is a wet etching formulation configured to selectively remove Ti, the formulation for stabilizing hydrogen peroxide including:
Zn ions at 2 to 7 parts per million;
KOH at 300 to 700 parts per million;
ammonium hydroxide at 15 to 60 parts per million;
hydrogen peroxide at 8 to 10 weight percent;
a 1:1 mixture of benzotriazole and 1-2-4 triazole at 70 to 200 parts per million; and
water at 90 weight percent or greater.

19. The formulation of claim 18, further comprising 1,000 to 5,000 molecular weight polyacrylic acid at 10 to 30 parts per million.

20. The formulation of claim 18, wherein the pH of the formulation is between 8 and 8.5.

* * * * *